(12) United States Patent
Kono et al.

(10) Patent No.: US 6,191,764 B1
(45) Date of Patent: Feb. 20, 2001

(54) METHOD OF DRIVING DISPLAY DEVICE

(75) Inventors: Ichiro Kono, Fussa; Masaharu Shioya, Akiruno; Hiroyasu Yamada, Hachioji, all of (JP)

(73) Assignee: Casio Computer Co., Ltd., Tokyo (JP)

(*) Notice: Under 35 U.S.C. 154(b), the term of this patent shall be extended for 0 days.

(21) Appl. No.: 09/056,184

(22) Filed: Apr. 6, 1998

(30) Foreign Application Priority Data

Apr. 14, 1997 (JP) .................................................... 9-110050

(51) Int. Cl.[7] ........................................................ G09G 3/10
(52) U.S. Cl. .............................. 345/76; 345/77; 313/504; 315/169.3
(58) Field of Search ............................ 345/76, 77, 81, 345/11, 207; 313/504; 315/169.3

(56) References Cited

U.S. PATENT DOCUMENTS

| | | | |
|---|---|---|---|
| 4,467,325 | * 8/1984 | Lustig | 345/207 |
| 4,777,402 | * 10/1988 | Mitsumori | 313/509 |
| 5,039,490 | * 8/1991 | Marsoner et al. | 422/82.01 |
| 5,157,262 | * 10/1992 | Marsoner et al. | 250/458.1 |
| 5,525,867 | * 6/1996 | Williams | 315/169.3 |
| 5,821,690 | * 10/1998 | Martens et al. | 313/506 |
| 5,965,979 | * 10/1999 | Friend et al. | 313/504 |

* cited by examiner

*Primary Examiner*—Bipin Shalwala
*Assistant Examiner*—Vincent E. Kovalick
(74) *Attorney, Agent, or Firm*—Frishauf, Holtz, Goodman, Langer & Chick, P.C.

(57) ABSTRACT

A phototransistor having a non-linear light vs. conductivity characteristics and an organic electroluminescent layer are sandwiched by a pair of electrodes, a predetermined voltage is applied to the pair of electrodes, and address light is irradiated on a phototransistor to let a current flow in the phototransistor, thus causing the electroluminescent layer to emit light. It is therefore possible to drive the device to present crosstalk-free gradation display with a high contrast ratio.

6 Claims, 15 Drawing Sheets

METHOD OF DRIVING DISPLAY DEVICE

BACKGROUND OF THE INVENTION

1. Field of the Invention

The present invention relates to a self lighting display device, and, more particularly, to an organic electroluminescent display device and a method of driving such a display device.

2. Description of the Related Art

An ordinary organic electroluminescent display device has a matrix of segment electrodes and common electrodes respectively formed in X and Y directions on the respective sides of an organic electroluminescent layer which emits light in accordance with the applied voltage. While the organic electroluminescent layer of such a simple matrix drive type of display device is excellent in luminescent response with respect to the applied voltage, it hardly has a luminescent memory property with respect to the applied voltage so that it merely emits light line by line only in the scan period. This requires that the luminescent luminance in the scan period should be increased. Increasing the voltage for that purpose results in an increased burden on the organic electroluminescent layer and accelerates the degradation of the organic electroluminescent layer. When this display device is driven at a high duty ratio to match with the high resolution, a crosstalk occurs, which provides displayed images with a low contrast ratio.

SUMMARY OF THE INVENTION

Accordingly, it is an object of the present invention to provide a display device which has a memory property and presents image display with a high contrast ratio, and to provide a method of driving such a display device.

To achieve the above object, a display device according to this invention comprises an electroluminescent address panel including an address electroluminescent layer for emitting light in accordance with injected carriers, first address electrodes provided on one side of the address electroluminescent layer and second address electrodes provided on the other side of the address electroluminescent layer; and an electroluminescent display panel including a first display electrode, a phototransistor provided on the first display electrode, showing a conductivity according to incidence of light emitted from the address electroluminescent layer and having a non-linear light vs. conductivity characteristics, a display electroluminescent layer, provided on the phototransistor, for emitting light as carriers are injected inside, and second display electrodes provided on the display electroluminescent layer.

In this invention, as address light is generated from the electroluminescent address panel and comes into the phototransistor, the phototransistor is optically excited to be turned on, allowing carriers to be injected into the display electroluminescent layer. Because of the non-linear light vs. conductivity characteristics, the phototransistor does not show a conductivity with respect to outside light or minute incident light produced by the crosstalk of the address electroluminescent layer. When the address light from the electroluminescent address panel is not incident to the display electroluminescent layer, the display electroluminescent layer does not emit light, thus ensuring display with a high contrast ratio.

The address electroluminescent layer and the display electroluminescent layer may contain organic electroluminescent materials. The electroluminescent layer containing an organic electroluminescent material, even if formed very thin, can emit light with a sufficient luminance and can secure a shorter distance for the address light to reach the phototransistor. It is thus possible to minimize the diffusion of the address light within the phototransistor, address a small area in the phototransistor and allow just the corresponding area of the display electroluminescent layer to emit light. This can lead to high-resolution display.

DETAILED DESCRIPTION OF THE PREFERRED EMBODIMENTS

Display devices according to individual preferred embodiments of the present invention will now be described with reference to the accompanying drawings.

First Embodiment

Figure 1:
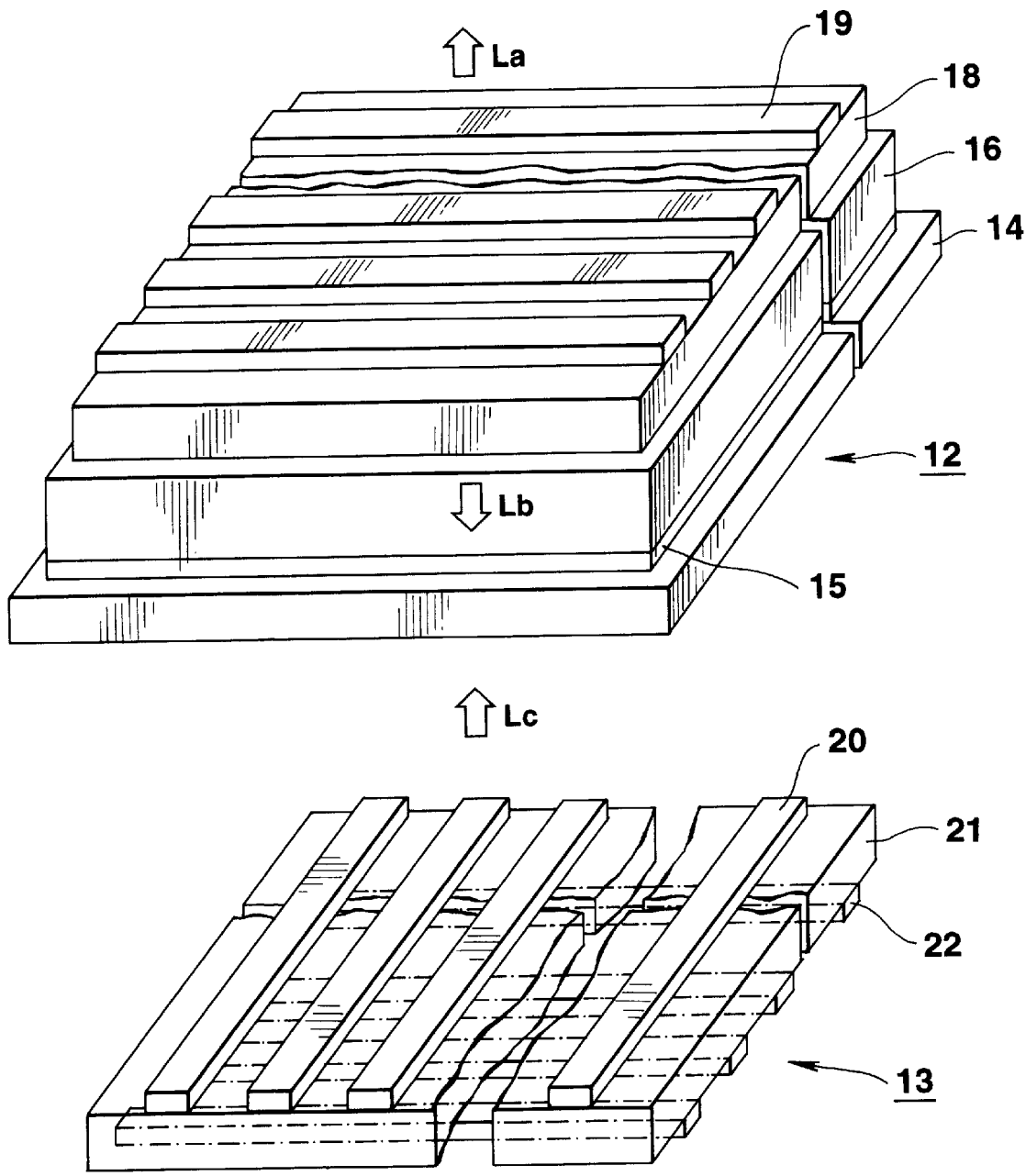
FIG. 1 is a perspective view illustrating the concept of a display device according to a first embodiment of this invention.

FIG. 1 presents a fundamental conceptual diagram illustrating a display device according to the first embodiment of this invention. The display device comprises an organic electroluminescent display panel 12 and an organic electroluminescent address panel 13.

The organic electroluminescent display panel 12 has a transparent substrate 14 of, for example, glass or synthesized resin. Formed on the front surface of the transparent substrate 14 over the entire display region is a single transparent electrode 15 which is a film of ITO or $In_2O_3(ZnO)x$ (x: a value greater than 0) having a thickness of about 1500 to 3000 angstroms and a sheet resistance of about 8 to 10 O. A bipolar phototransistor 16 is formed on this transparent electrode 15 over the whole display region. Provided on the bipolar phototransistor 16 is an organic electroluminescent layer 18 which emits light as the current flows inside. A plurality of transparent electrodes 19 are formed on the organic electroluminescent layer 18 in parallel to one another in a predetermined direction at the same intervals as the set intervals between pixels. The organic electroluminescent display panel 12 is constituted in the above form.

The basic structure of the organic electroluminescent address panel 13 will now be discussed. Referring to the figure, numeral "20" denotes a plurality of first address electrodes laid out in parallel to one another. Those first address electrodes 20, which are formed of a film of ITO or $In_2O_3(ZnO)x$ (x: a value greater than 0) having a thickness of approximately 1500 to 3000 angstroms and a sheet resistance of approximately 8 to 10 O, are aligned in a direction at the right angles to the transparent electrodes 19 of the organic electroluminescent display panel 12. The width of the first address electrodes 20 is set smaller than that of the transparent electrodes 19. An address organic electroluminescent layer 21 is formed adjacent to the first address electrodes 20 over the entire display region. Second address electrodes 22 equal in number to the transparent electrodes 19 are formed at the back of the address organic electroluminescent layer 21 in parallel to, and at positions corresponding to, the transparent electrodes 19. The width of the second address electrodes 22, like that of the first address electrodes 20, is set smaller than the width of the transparent electrodes 19. The first address electrodes 20 and the second address electrodes 22 form a matrix in the X and Y directions, with the overlapped (intersecting) portions of the first address electrodes 20 and the second address electrodes 22 being dot portions which generate address light. The organic electroluminescent address panel 13 is constructed in this manner.

The current that flows between the first address electrodes 20 and the second address electrodes 22 causes electrons and holes to be recombined inside the organic electroluminescent layer 21, generating singlet excitons to triplet excitons, so that the address organic electroluminescent layer 21 emits light of a predetermined wavelength range corresponding to the material or the like of the layer 21. The first address electrodes 20 has such a property as to pass at least the light component of the wavelength range, included in the light from the organic electroluminescent layer 21, which excites the base of the bipolar phototransistor 16 to generate electrons and holes in the base. The transparent substrate 14 and the transparent electrode 15 both also have such a property as to pass at least the light component of the wavelength range, included in the light from the organic electroluminescent layer 21, which excites the base of the bipolar phototransistor 16 to generate electrons and holes in the base.

Figure 2:
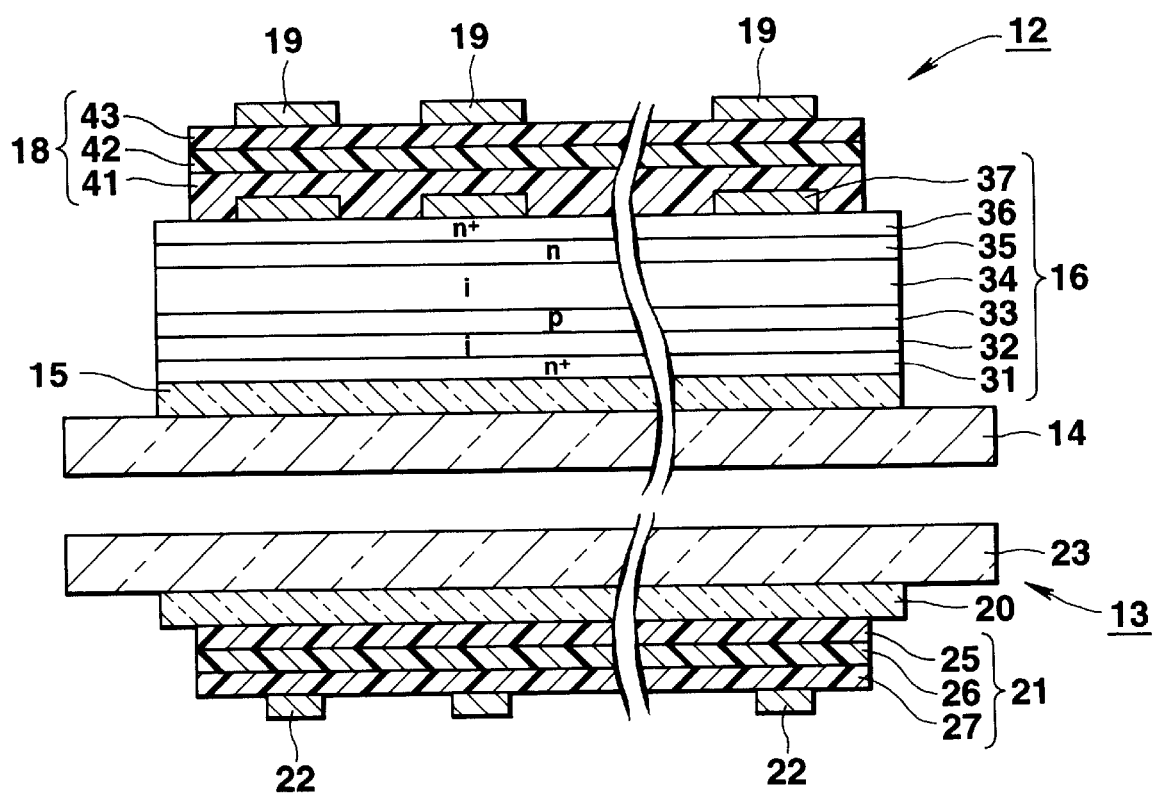
FIG. 2 is a cross-sectional view of the display device according to the first embodiment of this invention.

As shown in FIG. 2, the first address electrodes 20 are provided on a transparent substrate 23 which shows transparency to the light from the organic electroluminescent layer 21 and serve as anode electrodes. The organic electroluminescent layer 21, which consists of a plurality of organic carrier transport layers, has a hole transport layer 25, a light emitting layer 26 and an electron transport layer 27 laminated in the named order at the back of the first address electrodes 20. The second address electrodes 22, which serve as cathodes, are formed of metal with a low work function, such as Mg—In or Mg—Ag, in order to improve the electron injection to the electron transport layer 27.

The bipolar phototransistor 16 is an NPN type transistor which comprises an $n^+$ type amorphous silicon layer 31 of 500 to 900 angstroms in thickness as an emitter, an intrinsic amorphous silicon layer 32 of 100 to 300 angstroms in thickness, a p type amorphous silicon layer 33 of 100 to 300 angstroms in thickness as a base, an intrinsic amorphous silicon layer 34 of 2000 to 5000 angstroms in thickness, an n type amorphous silicon layer 35 of 30 to 100 angstroms in thickness, an $n^+$ type amorphous silicon layer 36 of 30 to 100 angstroms in thickness as a collector, and (p×q) rectangular carrier injection electrodes 37. When a predetermined voltage is applied between the $n^+$ amorphous silicon layer 31 and $n^+$ type amorphous silicon layer 36 and light of a predetermined wavelength range from the organic electroluminescent address panel 13 comes onto the p type amorphous silicon layer 33, carriers are generated inside the p type amorphous silicon layer 33. Of those carriers, holes are stored in the vicinity of the p amorphous silicon layer 33 to neutralize the static negative charges, causing the current to flow between the bipolar phototransistor portions 16. The rectangular carrier injection electrodes 37 contains ITO or $In_2O_3(ZnO)x$ (x: a value greater than 0) showing transparency to the visible light.

The organic electroluminescent layer 18 has a lamination of an electron transport layer 41, a light emitting layer 42 and a hole transport layer 43 each of an organic material. As the current flows inside the organic electroluminescent layer 18, the electrons transported from the electron transport layer 41 are recombined with the holes transported from the hole transport layer 43 in the light emitting layer 42, generating singlet excitons to triplet excitons, so that the organic electroluminescent layer 18 emits light of a predetermined wavelength range corresponding to the material or the like of the light emitting layer 42. The transparent electrodes 19 are formed of a film of ITO or $In_2O_3(ZnO)x$ (x: a value greater than 0) which has a thickness of approximately 1500 to 3000 angstroms and a sheet resistance of approximately 8 to 10 O and shows transparency to the light that is generated with the recombination of the electrons and the holes in the organic electroluminescent layer 18.

Figure 3:
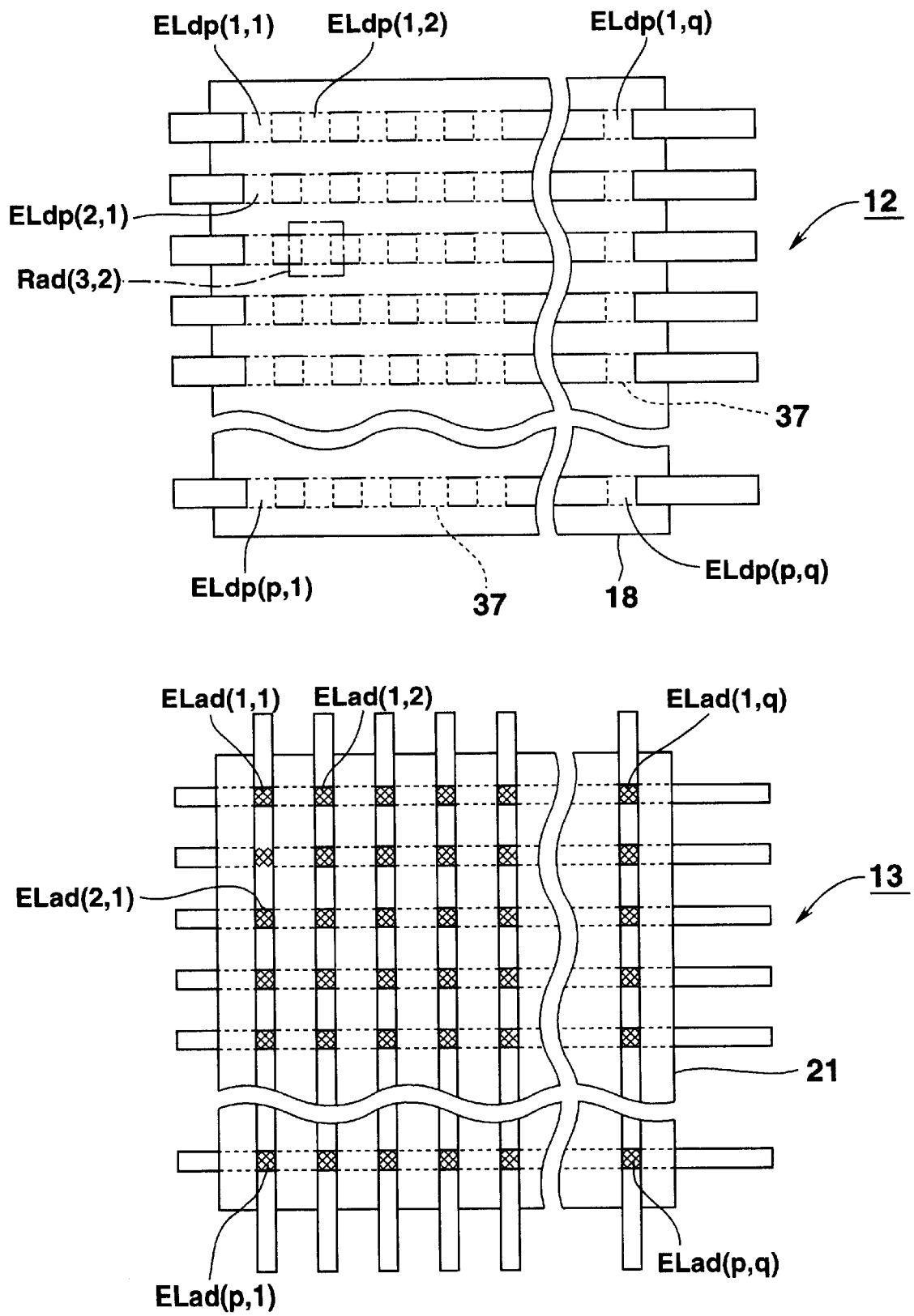
FIG. 3 is a plan view showing the arrangement of display light emitting dots ELdp and address light emitting dots ELad of the display device according to the first embodiment of this invention.

As shown in FIG. 3, the organic electroluminescent address panel 13 has a matrix of (p×q) address light emitting dots ELad that are defined by the (p×q) carrier injection electrodes 37. The organic electroluminescent display panel 12 has a matrix of (p×q) display light emitting dots ELdp corresponding to the address light emitting dots ELad of the organic electroluminescent address panel 13. Since the widths of the first address electrodes 20 and the second address electrodes 22 are set smaller than the width of the transparent electrodes 19 in the display device of this embodiment as mentioned earlier, the area of one display light emitting dot ELdp of the organic electroluminescent display panel 12 is wider than the area of one address light emitting dot ELad of the organic electroluminescent address panel 13. With this structure, even if the address light that has been generated from the organic electroluminescent address panel 13 is diffused to a region Rad until it reaches the bipolar phototransistor 16 of the organic electroluminescent display panel 12, the address light Lc surely comes into the planar area of the phototransistor 16 which corresponds to the associated display light emitting dot ELdp of the organic electroluminescent display panel 12 and does not enter the planar area of the phototransistor 16 which corresponds to the adjoining display light emitting dots ELdp. Accordingly, the organic electroluminescent display panel 12 can emit crosstalk-less light. It is possible to acquire a high electron injection density to inject electrons toward the electron transport layer 41 from the associated carrier injection electrode 37 whose electron injection area per pixel is wide enough for the address light to be diffused to the region Rad of the phototransistor 16 and which is substantially as wide as the address light emitting dot ELad that is narrower than the region Rad.

The fundamental operation of the display device according to this embodiment will be discussed below. FIG. 1 depicts the display device in a display status. First, a forward bias voltage $V_P$ (defined as a positive voltage) is applied between the transparent electrodes 19 and the transparent electrode 15 of the organic electroluminescent display panel 12. If light of the wavelength range which excites the phototransistor 16 does not come into the phototransistor 16 under this circumstance, most of the forward bias voltage $V_P$ is divided by the phototransistor 16 and the current greater than a threshold value does not flow through the organic electroluminescent layer 18, so that the organic electroluminescent display panel 12 does not emit light.

Then, as a voltage is applied between the first address electrodes 20 and the second address electrodes 22, a predetermined address light generating portion of the organic electroluminescent address panel 13 is selected to sequentially emit the address light Lc. This address light Lc comes into the phototransistor 16 at the area that corresponds to the address light generating portion. The phototransistor 16 in the area where the address light is incident generates carriers consisting of electrons and holes, the electrons being moved toward the collector side while the holes are stored in the p type amorphous silicon layer 33 to lower the potential. As a result, the current corresponding to the quantity of the carriers and the effective carrier present period flows between the phototransistor portions 16 for a predetermined period of time. The generation of this current causes the electrons from the phototransistor 16 to be injected into the electron transport layer 41. Further, the holes are injected into the hole transport layer 43 from the associated transparent electrode 19. Accordingly, the electrons injected in the electron transport layer 41 are recombined with the holes injected in the hole transport layer 43 in the light emitting layer 42. The excited energy originating from the recombination causes the light emitting layer 42 to generate display light La which will go out toward the transparent electrode 19. At the same time as the generation of this display light La, the light emitting layer 42 emits feedback light Lb which includes a component of the wavelength range that generates carriers in the phototransistor 16, toward the phototransistor 16.

Because the feedback light Lb produces carriers in the phototransistor 16 again to keep the phototransistor 16 on, the corresponding portion of the organic electroluminescent layer 18 keeps generating the display light La. The use of the feedback light Lb can apparently allow display with a memory property. Since only the phototransistor 16 in the area where the address light Lc has been incident is driven independently of the phototransistor portions 16 which are formed in association with the adjoining pixel regions, crosstalk-free display can be implemented. As the pixels are so aligned as to overlap the associated phototransistor portions 16, this display device becomes free of restriction to the pixel regions by thin film transistors and can implement display with very high resolution and high luminance.

When a phototransistor portion 16 is selected, the forward bias voltage $V_P$ greater than the threshold value at which the organic electroluminescent layer 18 emits light and a reverse bias voltage $V_R$ (defined as a negative voltage) whose electric field is directed in the opposite to that of the forward bias voltage $V_P$ and which does not cause the organic electroluminescent layer 18 to emit light regardless of the selected phototransistor portion 16 are applied between the transparent electrode 15 and the transparent electrodes 19. The forward bias voltage $V_P$ is applied to the organic electroluminescent layer 18 in a gradation period $P_G$, and the reverse bias voltage $V_R$ in a reset period $P_R$ where a light-emitting pixel is rendered to stop light emission.

A "K" gradation display method for the display device according to this embodiment will be explained with attention given to one pixel referring to FIGS. 4A through 4H (K being an integer equal to or greater than 2). In this description, the times acquired by dividing the gradation period $P_G$ by "K–1" are defined as subfields. The times of the "K–1" subfields should not necessarily be the same, and they may be given respective weights according to the time response of the organic electroluminescent display panel 12 to improve the gamma characteristics.

Figure 4:
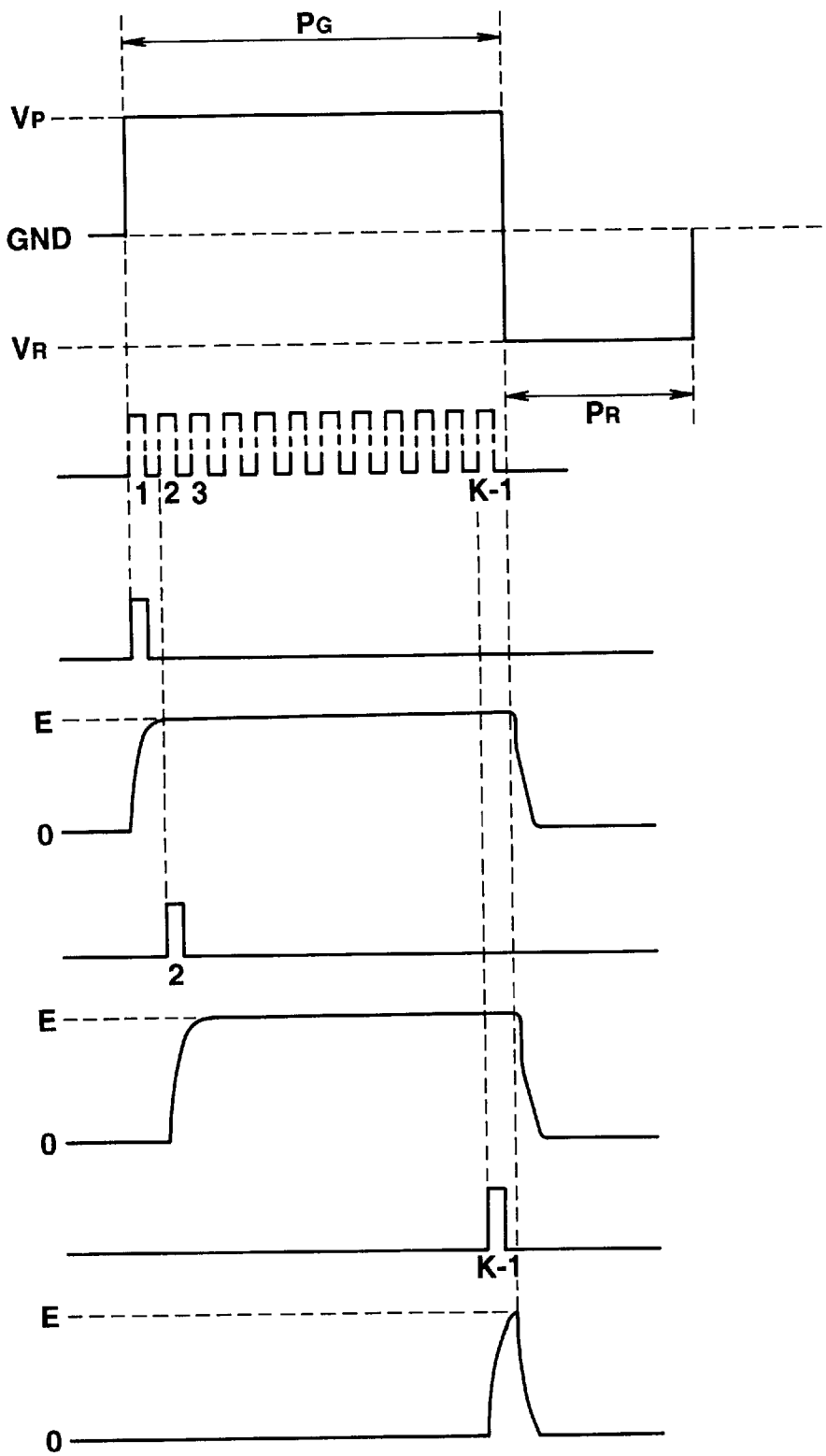
FIGS. 4A through 4H are waveform charts illustrating gradation control on one pixel by subfield driving in the first embodiment.

As shown in FIG. 4A, the forward bias voltage $V_P$ and the reverse bias voltage $V_R$ are alternately applied between one transparent electrode 19 corresponding to a single display light emitting dot ELdp(X, Y) and the transparent electrode 15 of the organic electroluminescent display panel 12.

To permit the display light emitting dot ELdp(X, Y) to emit light at the maximum luminance gradation "K–1," the X-th row of the second address electrodes 22 of the organic electroluminescent address panel 13 is selected at the timing as shown in FIG. 4B to produce the address light Lc. Note that the vertical scale in the figure denotes the luminance (cd/m$^2$). When the address light Lc as shown in FIG. 4C comes into the phototransistor 16, the organic electroluminescent layer 18 at the display light emitting dot ELdp(X, Y) produces the display light La and the feedback light Lb both with the spontaneous luminance E (cd/m$^2$) as shown in FIG. 4D in substantially one gradation period $P_G$. The visually sensible brightness then is a product of the luminance of unit time and the emission time.

To cause the display light emitting dot ELdp(X, Y) to emit light at the luminance gradation "K–2," the X-th row of the second address electrodes 22 is selected at the timing as shown in FIG. 4E to produce the address light Lc for a time greater by (K–2)/(K–1) than the one for the maximum luminance gradation "K–$_1$," as shown in FIG. 4F.

To permit the display light emitting dot ELdp(X, Y) to emit light at the luminance gradation of "1," the X-th row of the second address electrodes 22 is selected at the timing as shown in FIG. 4G to produce the address light Lc for a time greater by 1/(K−1) than the one for the maximum luminance gradation "K−1" as shown in FIG. 4H.

As apparent from the above, it is possible to set the light emission time of the display light emitting dot ELdp(X, Y) in the gradation period $P_G$ to control the luminescent luminance gradation by controlling the timing for producing the address light Lc from the organic electroluminescent address panel 13.

Figure 5:
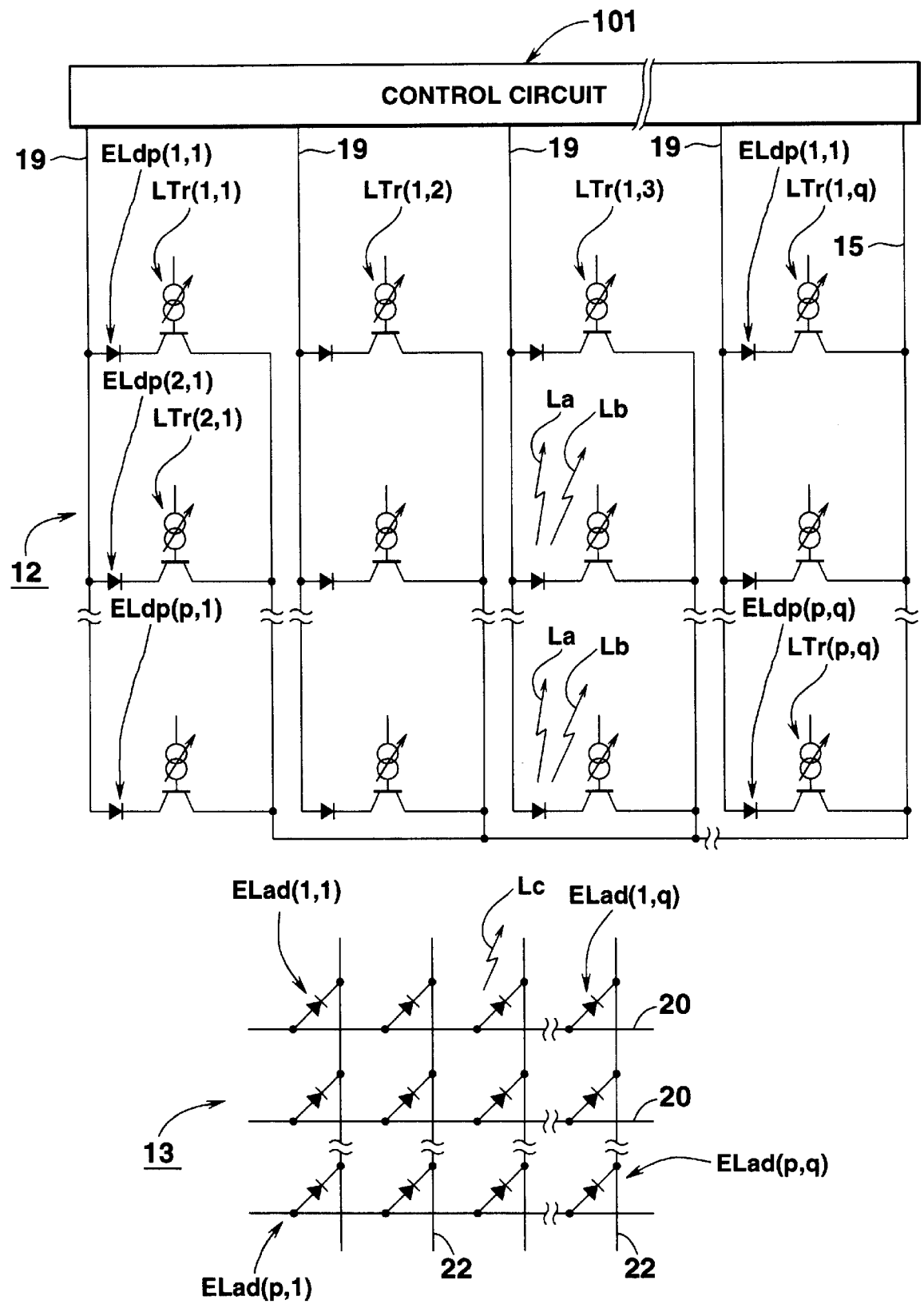
FIG. 5 is a circuit structural diagram of the display device of the first embodiment.

FIG. 5 presents a circuit structural diagram of the organic electroluminescent display panel 12, the organic electroluminescent address panel 13 and a control circuit 101 which drives the panels 12 and 13. The phototransistors LTr(1, 1) to LTr(p, q) of the phototransistor 16, which are associated with the respective pixel regions where the address light Lc, emitted from the address organic electroluminescent layer 21 at the address light emitting dots ELad(1, 1) to ELad(p, q) at the intersections of the first address electrodes 20 and the second address electrodes 22, is irradiated or not irradiated, are turned on or off to switch on or off the display light emitting dots ELdp(1, 1) to ELdp(p, q) associated with the pixel regions. As a result, the display light La and the feedback light Lb are irradiated or not irradiated. The first row of the second address electrodes 22 is selected to allow the dots ELad(1, 1), ELad(1, 2), . . . , and ELad(1, q) to emit light in accordance with a video signal Sv, then the second row, the third row and so forth are likewise selected one after another; the selection period for one cycle from the first row to the p-th row is defined as one subfield period.

Figure 6:
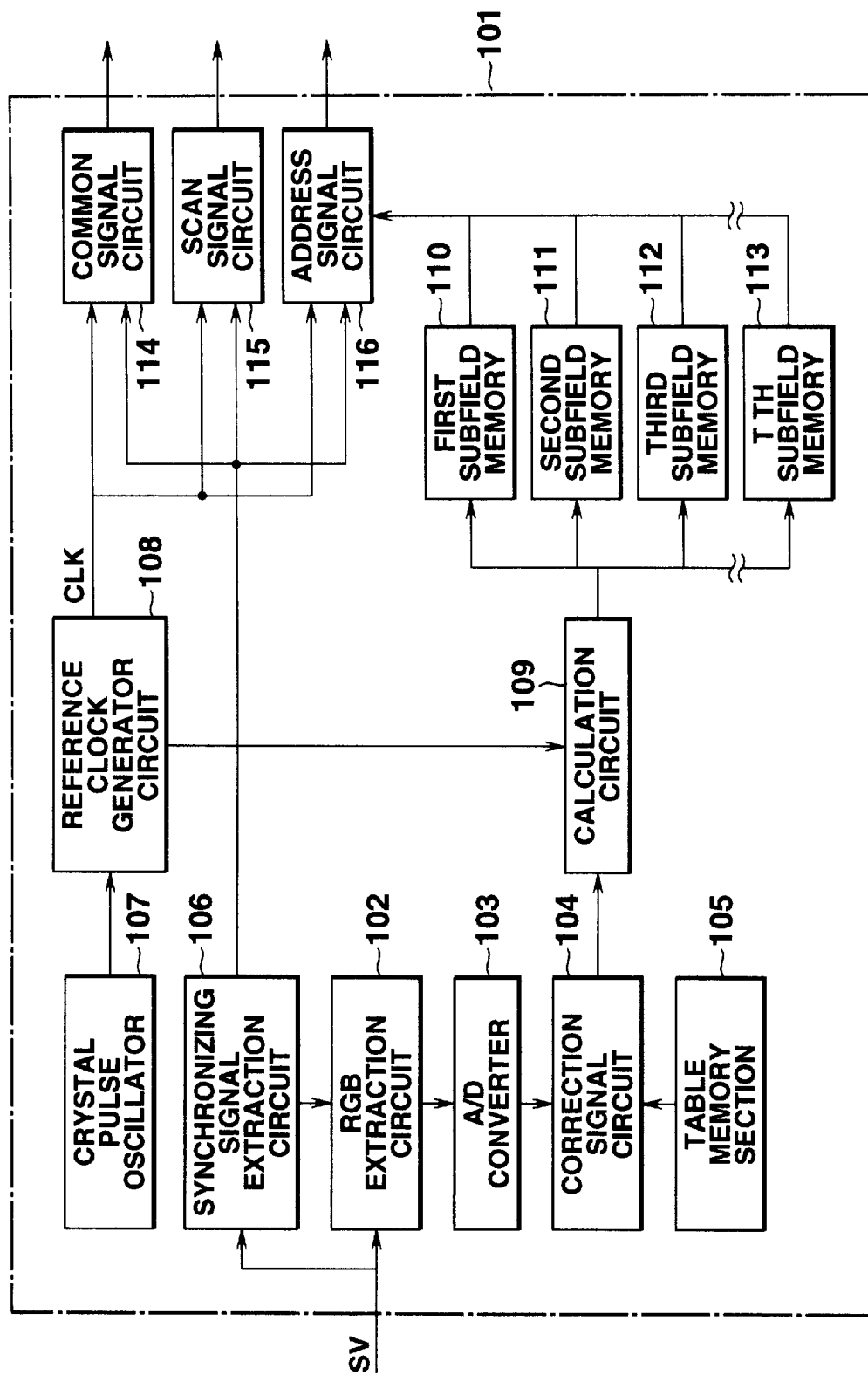
FIG. 6 is a block diagram depicting the structure of a control circuit which performs subfield driving on an organic electrolumine scent display panel and an organic electroluminescent address panel.

FIG. 6 is a block diagram depicting the structure of the control circuit 101 which drives the organic electroluminescent display panel 12 and the organic electroluminescent address panel 13.

As illustrated, the control circuit 101 comprises an RGB extraction circuit 102, an A/D converter 103, a correction signal circuit 104, a table memory section 105, a calculation circuit 109, a synchronizing signal extraction circuit 106, a crystal pulse oscillator 107, a reference clock generator circuit 108, a calculation circuit 109, a first subfield memory 110, a second subfield memory 111, a third subfield memory 112, a fourth subfield memory 113, a common signal circuit 114, a scan signal circuit 115 and an address signal circuit 116.

The video signal Sv which is display data to be externally supplied to the control circuit 101 for each row of the second address electrodes 22 is input to the RGB extraction circuit 102 and the synchronizing signal extraction circuit 106. The synchronizing signal extraction circuit 106 extracts a horizontal sync signal and a vertical sync signal from the video signal Sv. Based on the horizontal sync signal and vertical sync signal extracted by the synchronizing signal extraction circuit 106, the RGB extraction circuit 102 extracts image signals Sp of red (R), green (G) and blue (B) from the luminance signal and color difference signal in the video signal Sv and outputs them in a predetermined order. Based on a system clock generated from the crystal pulse oscillator 107, the reference clock generator circuit 108 produces a reference clock signal CLK for measuring the supply time of the address signal to let a predetermined current flow between the first address electrodes 20 and the second address electrodes 22 in order to start light emission from the organic electroluminescent address panel 13, the scan time of the scan signal for sequentially scanning a plurality of transparent electrodes 19 of the organic electroluminescent display panel 12 and/or the time for supplying the common signal to the transparent electrode 15.

The correction signal circuit 104 adequately compensates the image signals Sp according to the contents of the table memory section 105 and outputs the compensated signals. The calculation circuit 109 temporarily saves one frame period $P_F$ of image signals Sp from the first row to the p-th row of the second address electrodes 22 row by row of the second address electrodes 22. The image signals Sp stored in the calculation circuit 109 are signals indicated by a binary number of T digits for the gradation number of "K" where $\log_2 K = T$.

First, of the image signals Sp to be supplied to the entire pixels in one frame period $P_F$ equivalent to the display time for one sheet of images, the first subfield of data of the first row, the second row and so forth to the p-th row, equivalent to the maximum luminance unit "K−1," are output to the first subfield memory 110 row by row in the order of the first row, the second row, . . . , and the p-th row based on the timings given by the reference clock generator circuit 108. Next, of the image signals Sp of the first row to the p-th row, the second subfield of data equivalent to the luminance gradation "K−2" are output to the second subfield memory 111 row by row in the order of the first row, the second row, . . . , and the p-th row. Then, of the image signals Sp of the first row to the p-th row, the third subfield of data equivalent to the luminance gradation "K−3" are output to the third subfield memory 112 row by row in the order of the first row, the second row, . . . , and the p-th row. A similar operation is carried out until, finally, of the image signals Sp of the first row to the p-th row, the (K−1)-th subfield of data equivalent to the luminance gradation "1" are output to the T-th subfield memory 113 row by row in the order of the first row, the second row, . . . , and the p-th row. One frame of image signals Sp are output to the respective subfield memories 110–113. The greater the value of the T-digit data of the image signal Sp, the brighter the image of the associated pixel is. That is, this organic electroluminescent display device has "K" gradations from gradation "0" to gradation "K−1" and the display luminance of the organic electroluminescent display panel 12 goes brighter from the dark state as the gradation approaches gradation "K−1" from gradation "0."

The common signal circuit 114 supplies the common signal to the transparent electrode 15 of the organic electroluminescent display panel 12 based on the horizontal sync signal extracted by the synchronizing signal extraction circuit 106 and the reference clock CLK produced by the reference clock generator circuit 108.

The scan signal circuit 115 supplies the scan signal for sequentially selecting the transparent electrodes 19 of the organic electroluminescent display panel 12 to the transparent electrodes 19 based on the horizontal sync signal extracted by the synchronizing signal extraction circuit 106 and the reference clock CLK produced by the reference clock generator circuit 108.

The address signal circuit 116 receives gradation data from the individual subfield memories 110–113 and sends address signals to the first address electrodes 20 and the second address electrodes 22 to properly emit the address light Lc in the order of the first row, the second row and so forth to the p-th row, based on the horizontal sync signal and vertical sync signal extracted by the synchronizing signal extraction circuit 106 and the reference clock CLK produced by the reference clock generator circuit 108.

A description will now be given of the operation of the organic electroluminescent display device according to this embodiment for 4-gradation display.

The R, G and B image signals Sp extracted at predetermined timings in the RGB extraction circuit 102 are converted to digital signal in the A/D converter 103 row by row in the order of the first row, the second row, . . . , and the p-th row. The digital signals are then subjected to compensation such as gamma compensation in the correction signal circuit 104 before being stored in the calculation circuit 109. As mentioned above, the image signals Sp to be stored in the calculation circuit 109 are each expressed by a 2-digit binary number. Alternatively, it is possible to implement gradation display by sending data of a digital image signal Sd output from a personal computer PC or the like, instead of the video signal Sv, directly to the correction signal circuit 104.

Figure 7:
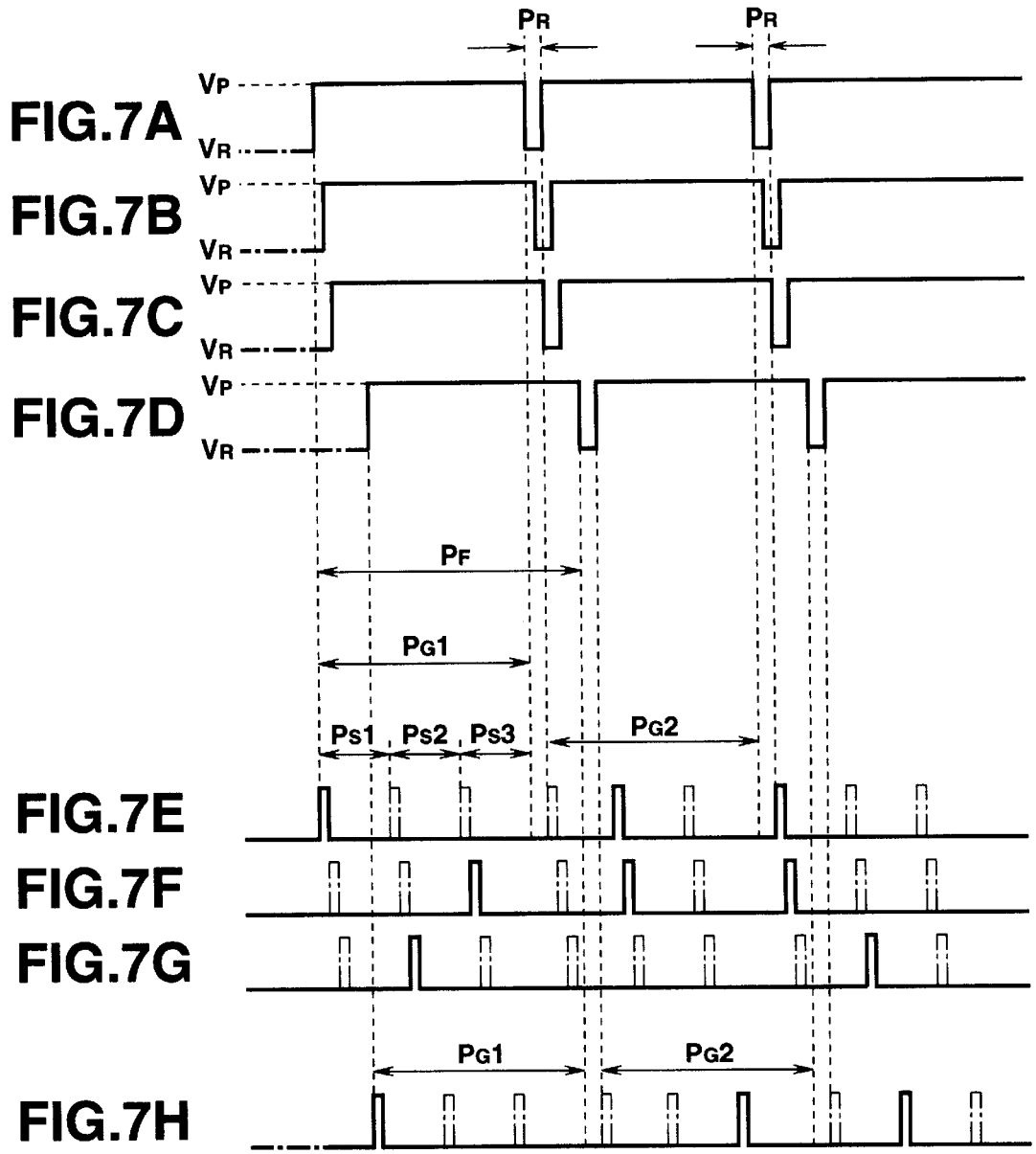
FIGS. 7A through 7H are waveform charts illustrating gradation control on a matrix of pixels by subfield driving in the first embodiment.
Figure 8:
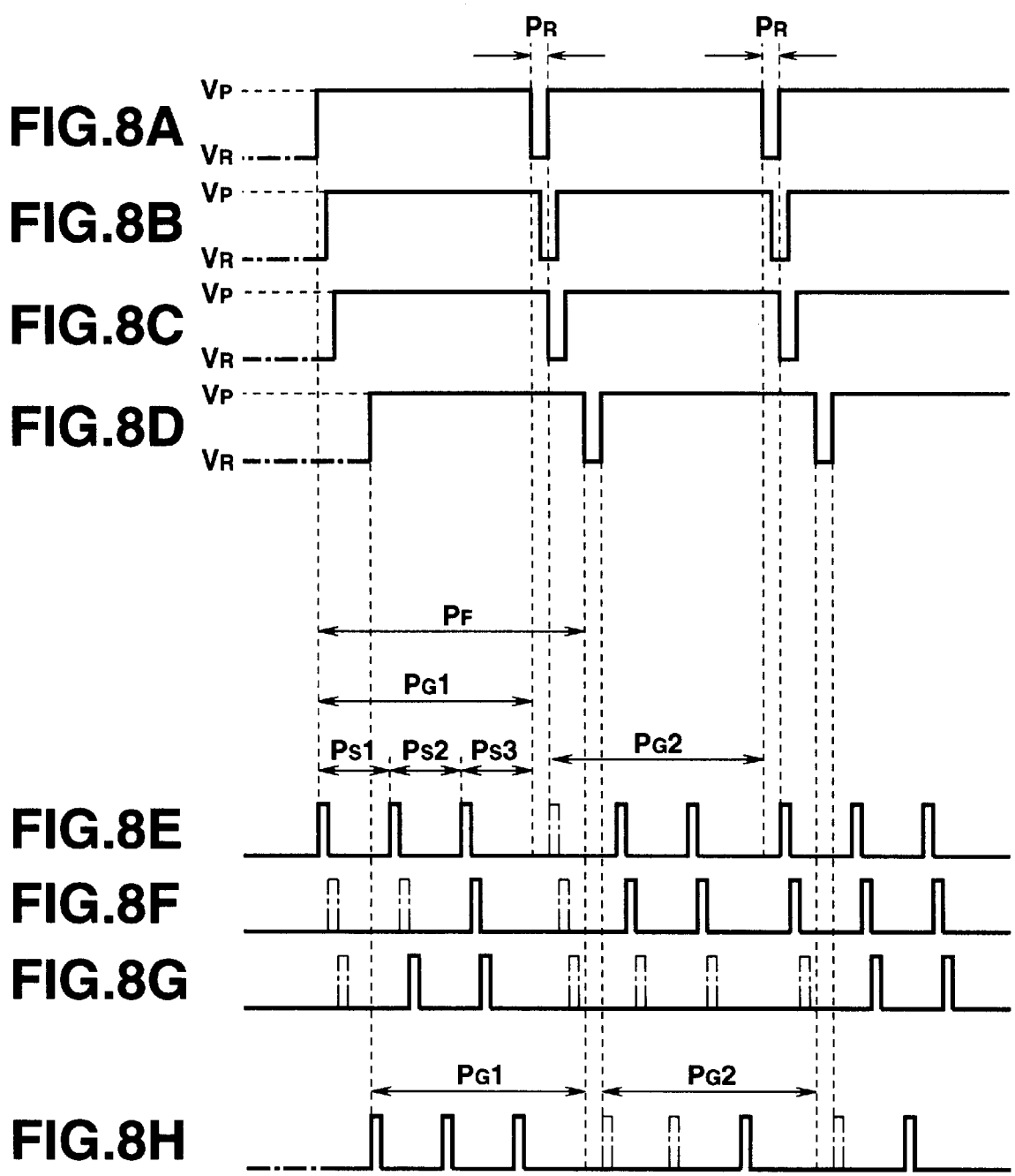
FIGS. 8A through 8H are waveform charts illustrating another gradation control on a matrix of pixels by subfield driving in the first embodiment.

FIGS. 7A through 7C respectively show voltages to be supplied to the first to third rows of the organic electroluminescent layer 18 of the organic electroluminescent display panel 12, FIG. 7D shows a voltage to be supplied to the p-th row of the organic electroluminescent layer 18, FIGS. 7E through 7G respectively indicate address light signals to be supplied to predetermined address light emitting dots ELad of the first to third rows of the organic electroluminescent address panel 13, and FIG. 7H indicates an address light signal to be supplied to a predetermined address light emitting dot ELad of the p-th row. The calculation circuit 109 provides the first subfield memory 110 with data among those of the compensated image signals Sp of the first row, the second row, . . . , and the p-th row, which is addressed to the address light emitting dot ELad corresponding to the display light emitting dot ELdp that emits light with the maximum gradation "3." In accordance with the reference clock CLK, the address signal circuit 116 sends the address signals to the first address electrodes 20 and the second address electrodes 22 in the order of the first row, the second row and so forth to the p-th row in the first subfield period $P_S1$, in accordance with data from the first subfield memory 110 as shown in FIGS. 7E to 7H. As a result, the selected address light emitting dots ELad of the organic electroluminescent address panel 13 sequentially emit lights row by row.

At this time, the common signal circuit 114 supplies the common signal to the transparent electrode 15 of the organic electroluminescent display panel 12 in the gradation period $P_G$ based on the horizontal sync signal and the reference clock CLK, and the scan signal circuit 115 supplies the scan signal to the transparent electrodes 19 of the organic electroluminescent display panel 12 in the order of the first row, the second row, . . . and the p-th row in the gradation period $P_G$ based on the horizontal sync signal and the reference clock CLK, thereby applying the forward bias voltage $V_P$ as shown in FIGS. 7A–7D to the organic electroluminescent layer 18 and the phototransistor 16. The phototransistor LTr that has received the address light from the organic electroluminescent address panel 13 will have a low resistance and keeps emitting light until the reset period $P_R$ or for the first gradation period $P_G1$ to provide display with the luminance gradation "3."

In the second subfield period $P_S2$, the address signal circuit 116 sends the address signals to the first address electrodes 20 and the second address electrodes 22 in the order of the first row, the second row, . . . and the p-th row as shown in FIGS. 7E–7H based on the reference clock CLK in accordance with the data from the second subfield memory 111, so that the selected address light emitting dots ELad of the organic electroluminescent address panel 13 sequentially emit lights row by row. At this time, the forward bias voltage $V_P$ is supplied to the individual rows of display light emitting dots ELdp, which keep emitting light for a period which is the first subfield period $P_S1$ subtracted from the first gradation period $P_G$ in accordance with the light emission from the address light emitting dots ELad, thus presenting display with the luminance gradation "2."

In the third subfield period $P^S3$, the address signal circuit 116 sends the address signals to the first address electrodes 20 and the second address electrodes 22 in the order of the first row, the second row, . . . and the p-th row as shown in FIGS. 7E–7H based on the reference clock CLK in accordance with the data from the third subfield memory 112, so that the selected address light emitting dots ELad of the organic electroluminescent address panel 13 sequentially emit lights row by row. At this time, the forward bias voltage $V_P$ is supplied to the individual rows of display light emitting dots ELdp, which keep emitting light for a period which is the first subfield period $P_S1$ and the second subfield period $P_S2$ subtracted from the first gradation period $P_G$ in accordance with the light emission from the address light emitting dots ELad, thus presenting display with the luminance gradation "1."

Those display light emitting dots ELdp which correspond to the address light emitting dots ELad that have not emitted light in the first subfield period $P_S1$ to the third subfield period $P_S3$ do not emit light, giving display with the luminance gradation "0."

When each first gradation period $P_G1$ ends, the reverse bias voltage $V_R$ is applied to the display light emitting dots ELdp of the first row to the p-th row which are keeping light emission in the reset period $P_R$, so that carriers are gone from the organic electroluminescent layer 18, which in turn stops light emission, and the feedback light Lb vanishes, setting the phototransistor 16 off to stop light emission. When the reset period $P_R$ ends, a second gradation period $P_G2$ like the first gradation period $P_G1$ starts.

Although a single address light emitting dot ELad emits the address light once in a single gradation period $P_G$ in the above-described embodiment, the control circuit 101 may be designed in such a manner that the address light is emitted by the number of gradations in accordance with the target gradation as shown in FIGS. 8A to 8H. FIGS. 8A–8H respectively corresponding to FIGS. 7A–7H illustrate the same gradation display examples. In this case, as new address light is emitted in the next subfield period $P_S$, the current which flows in the phototransistor 16 but slightly decreases in the subfield period $P_S$ becomes smaller.

Figure 11:
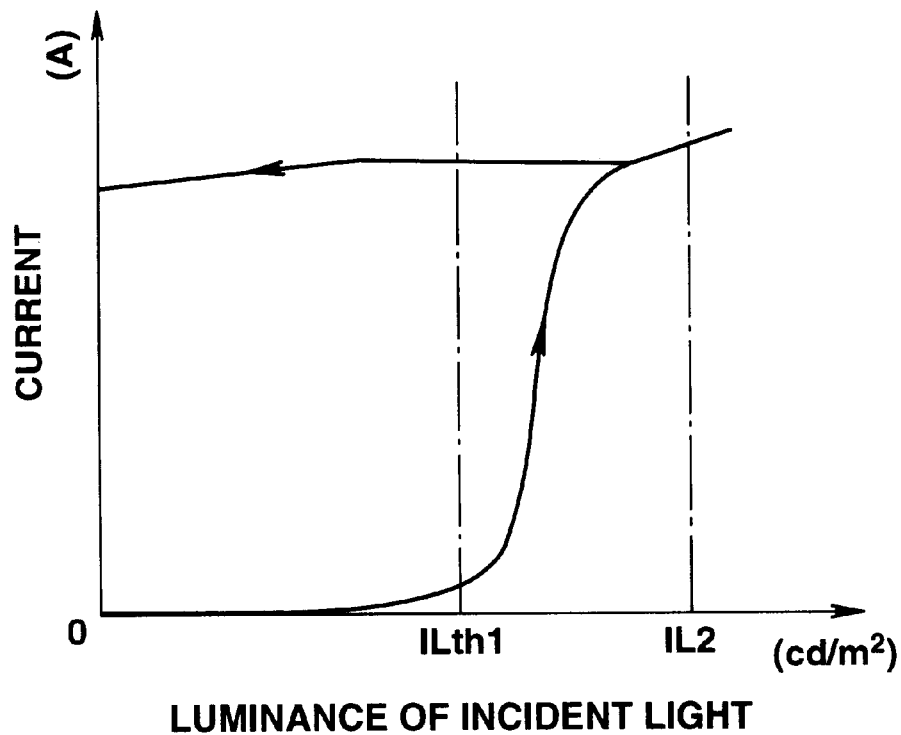
FIG. 11 is a graph showing the current vs. luminance characteristics of a phototransistor in this invention.
Figure 12:
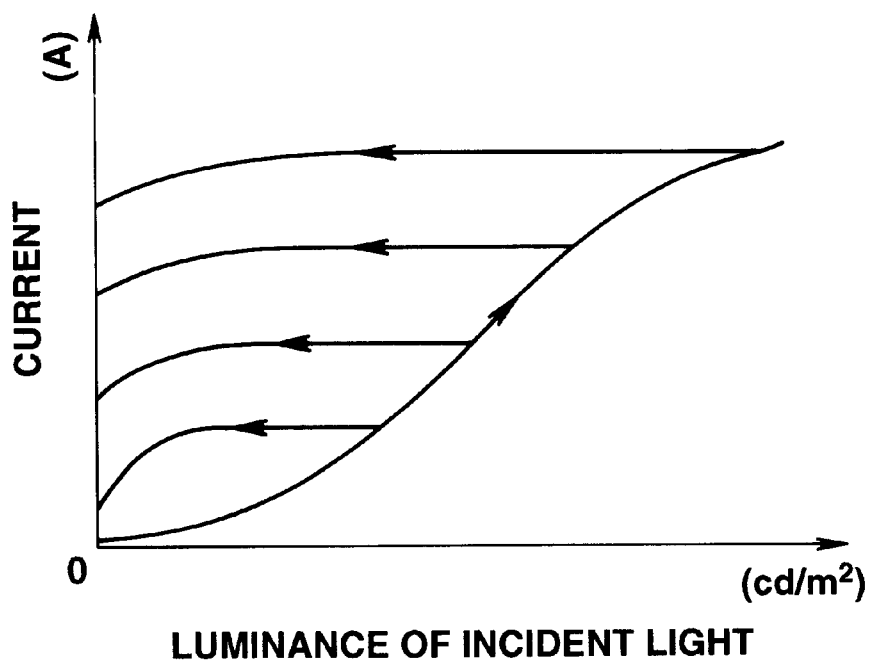
FIG. 12 is a graph showing the current vs. luminance characteristics of a photoconductive layer of zinc oxide as a comparative example.

The above is the description of the structure and operation of this embodiment and its drive method. As shown in FIG. 11, the bipolar phototransistor 16 of the organic electroluminescent display panel 12 has a non-linear light vs. conductivity characteristics which shows a sharp rising current originating from the incident light or a sharp luminance of the organic electroluminescent display panel 12, so that if the address light with a luminance beyond the luminance IL2 is irradiated from the organic electroluminescent address panel 13, a current enough for the bipolar phototransistor 16 to keep a substantially sufficient luminance flows, allowing the organic electroluminescent display panel 12 to emit light. Even when incidence of light from the organic electroluminescent address panel 13 ends, the bipolar phototransistor 16 keeps letting the current flow due to the feedback light Lb from the organic electroluminescent layer 18, so that the organic electroluminescent display panel 12 continues light emission until the application of the forward bias voltage to the transparent electrodes 19 and 15 is stopped. As the threshold value ILth1 is set higher than the luminances of the outside light and the crosstalk-induced weak light or the like from the address light emitting dots ELad, the bipolar phototransistor portions 16 into which no address light comes are not enabled to emit light, and the luminance in the non-emission mode is low so that crosstalk-free gradation display with a high contrast ratio can be achieved. A display device of a comparative example which uses a single photoconductive layer of zinc oxide in place of the bipolar phototransistor 16 of this invention shows the characteristics as illustrated in FIG. 12, the conductivity of the photoconductive layer is changed by light with a slight luminance, such as the outside light or the crosstalk light, thus significantly affecting the display luminance of the organic electroluminescent display panel 12. It is therefore difficult to control the gradation of this comparative example.

Further, the above-described structure can allow the organic electroluminescent display panel 12 to be actively driven without using transistors for the individual pixels, and can thus increase the aperture of the display light emitting dots ELdp. Because there is no need to individually prepare active elements pixel by pixel, the number of the fabrication steps is reduced. Furthermore, the simple structure can increase the yield and ensure fabrication at a low cost. The high yield, which can be expected, allows a large and practical display screen to be designed. Moreover, the use of the organic electroluminescent layer 18 can achieve driving on a low voltage, e.g., 5 to 10 volts, and low dissipation power.

The display device according to this invention may have a pin hole mask of a light-shielding material provided between the transparent substrate 14 of the organic electroluminescent display panel 12 the transparent substrate 23 of the organic electroluminescent address panel 13. This pin hole mask has holes between the address light emitting dots ELad that face the display light emitting dots ELdp. Even if the address light Lc generated at each address light emitting dot ELad of the organic electroluminescent address panel 13 is diffused, only the address light Lc which travels straight toward the associated phototransistor portion 16 is passed. This prevents the address light Lc from coming into other phototransistor portions 16 than the associated phototransistor portion 16, and can thus suppress the occurrence of malfunction of the organic electroluminescent display panel 12. The use of the pin hole mask with such a function makes it unnecessary to form the first address electrodes 20 and the second address electrodes 22 of the organic electroluminescent address panel 13 narrower than the transparent electrodes 19 and the transparent electrode 15 of the organic electroluminescent display panel 12. This feature can allow the use of the same mask irrespective of the case of patterning the individual electrodes using photolithography or the case of patterning them by using a transfer mask, and can thus facilitate the fabrication as well as alignment of the components of the organic electroluminescent display panel 12 with those of the organic electroluminescent address panel 13. This pin hole mask can easily be formed by forming a film of a light-shielding material in front of the transparent write substrate 23 and patterning holes in this film using photolithography. The other actions, operations and advantages of this modification are the same as those of the first embodiment.

The distance d from the phototransistor 16 to the organic electroluminescent layer 21 in the organic electroluminescent address panel 13 may be set to satisfy the relation that is expressed as follows.

$$d=(m/2)\cdot\lambda$$

where m is a natural number and $\lambda$ is the wavelength of the address light. This setting makes the address light Lc produced from the organic electroluminescent address panel 13 have a resonator structure and reduce the light intensity in other directions than the direction normal to the transparent write substrate 23 due to coherence of light. It is therefore possible to prevent the display device from malfunctioning due to the address light.

Figure 17:
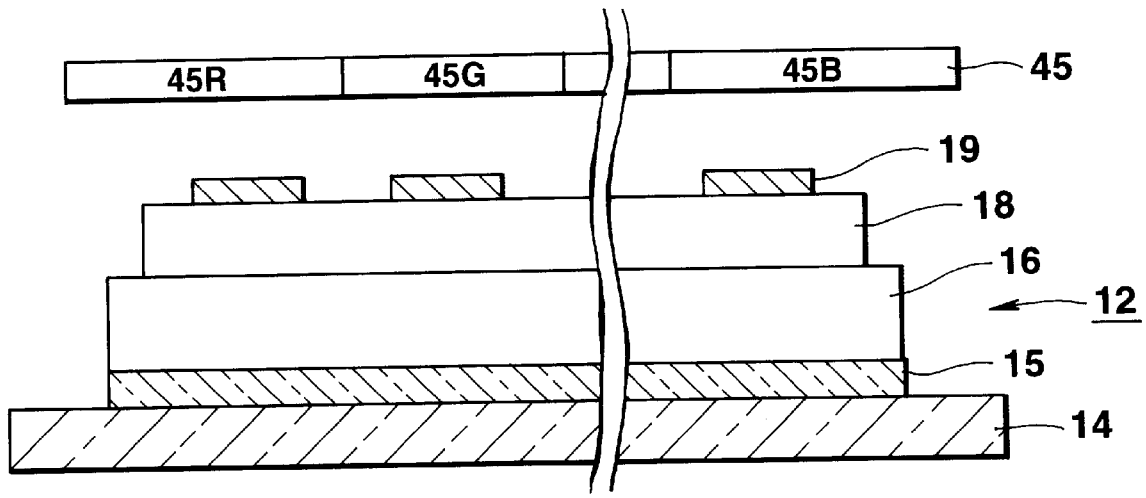
FIG. 17 is a cross-sectional view showing color filters added to the organic electroluminescent display panel of the fourth embodiment.

FIG. 17 is a cross-sectional view of another organic electroluminescent display panel 12 of the display device. In this modification, white light is produced from the organic electroluminescent layer 18 which is formed over the whole display region. The organic electroluminescent layer 18 has the electron transport layer 41, the light emitting layer 42 and the hole transport layer 43 laminated in order on the phototransistor 16. Particularly, the light emitting layer 42 contains three kinds of dopants of DCM (red), coumarin (green) and TPB (blue). A red filter 45R, a green filter 45G and a blue filter 45B are laid in front of the organic electroluminescent display panel 12 in association with the individual pixels. The structure of the unillustrated organic electroluminescent address panel 13 in this modification is the same as that of the first embodiment.

This modification can generate lights of individual colors by band-limiting the display light emitted frontward from the organic electroluminescent layer 18 to the R, G and B light components at the respective color filters 45R, 45G and 45B which disperse the display light to red, green and blue lights and can thus ensure color display. In this modification, particularly, as the material for the organic electroluminescent layer 18 is common to the individual pixels and the layer 18 has only to be formed over the entire display region, requiring no patterning step, so that the number of processes can be reduced. This can lead to improvement of the yield and cost reduction. The white light that is generated from this organic electroluminescent layer 18 is close to the light from a standard light source C (x=0.313, y=0.316).

Figure 18:
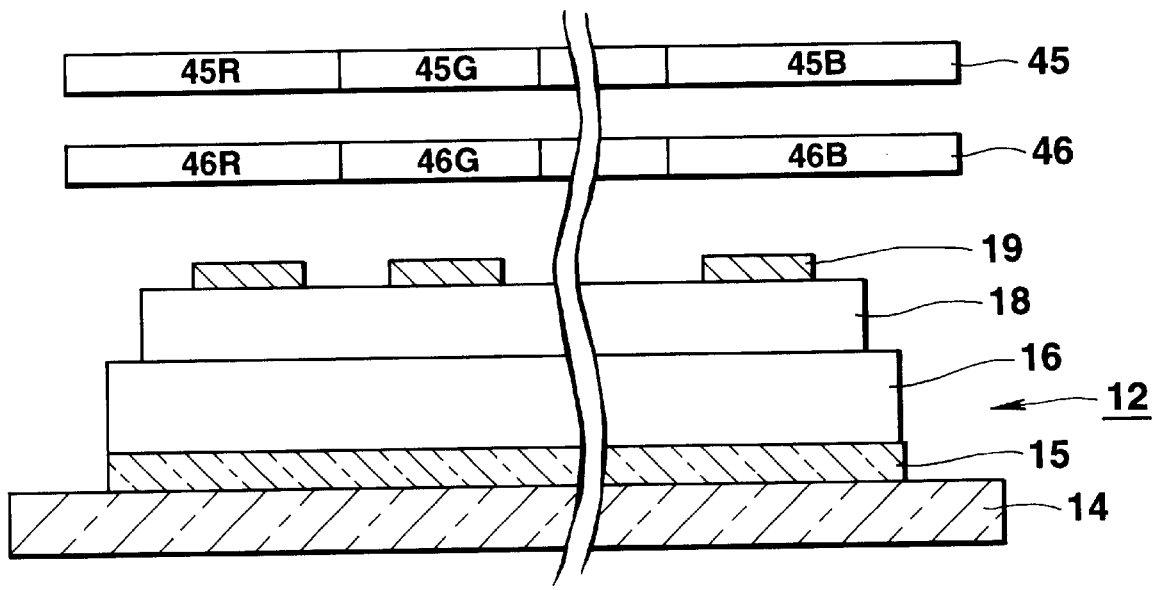
FIG. 18 is a cross-sectional view showing color filters and wavelength conversion layers added to the organic electroluminescent display panel of the fourth embodiment.

FIG. 18 is a cross-sectional view showing yet another organic electroluminescent display panel 12. This organic electroluminescent display panel 12 is designed in such a manner as to produce light including ultraviolet light or blue light with a wavelength of 350 nm to 450 nm over the entire display region, and wavelength conversion layers 46R, 46G and 46B, which absorb he blue light or ultraviolet light and produce red, green and blue lights of longer wavelengths, and color filters 45R, 45G and 45B are arranged in order in front of this organic electroluminescent display panel 12. The structure of the organic electroluminescent address panel 13 in this modification is the same as that of the first embodiment.

To produce blue light from the organic electroluminescent layer 18, the electron transport layer 41 should be formed of aluminum-tris(8-hydroxyquinolinate) (hereinafter Alq3), the light emitting layer 42 should be formed of a group of blue light emitting materials called distyrylarylene derivatives (e.g., DTVBi), and the hole transport layer 43 should be formed of N,N'-di(a-naphthyl)-N,N'-diphenyl-1,1'-biphenyl-r,4'-diamine (hereinafter a-NPD). To produce ultraviolet light from the organic electroluminescent layer 18, the light emitting layer 42 should be formed of poly (vinylcarbazole), polysilane or the like, while the electron transport layer 41 and the hole transport layer 43 should be formed of Alq3 and a-NPD, respectively. The wavelength conversion layers 46R, 46G and 46B are formed by properly mixing fluorescent substances that are excited for light emission by light of the wavelength range of blue light or ultraviolet light so that they convert the excited lights to lights of the wavelengths of the respective colors.

Blue light or ultraviolet light produced from the organic electroluminescent layer 18 is converted to lights of the individual colors by the wavelength conversion layers 46R, 46G and 46B, and are then filtered through the color filters 45R, 45G and 45B so that clear colors with a high purity can be displayed. Since the color filters 45R, 45G and 45B can absorb the wavelength band of blue light or ultraviolet light which excites the wavelength conversion layers 46R, 46G and 46B, it is possible to prevent outside-light originated light emission of the wavelength conversion layers 46R, 46G and 46B. This modification simply requires the generation of light of a single color from the organic electroluminescent layer 18 in order to be able to generate lights of a plurality of colors with a high efficiency and high luminance.

Second Embodiment

Figure 9:
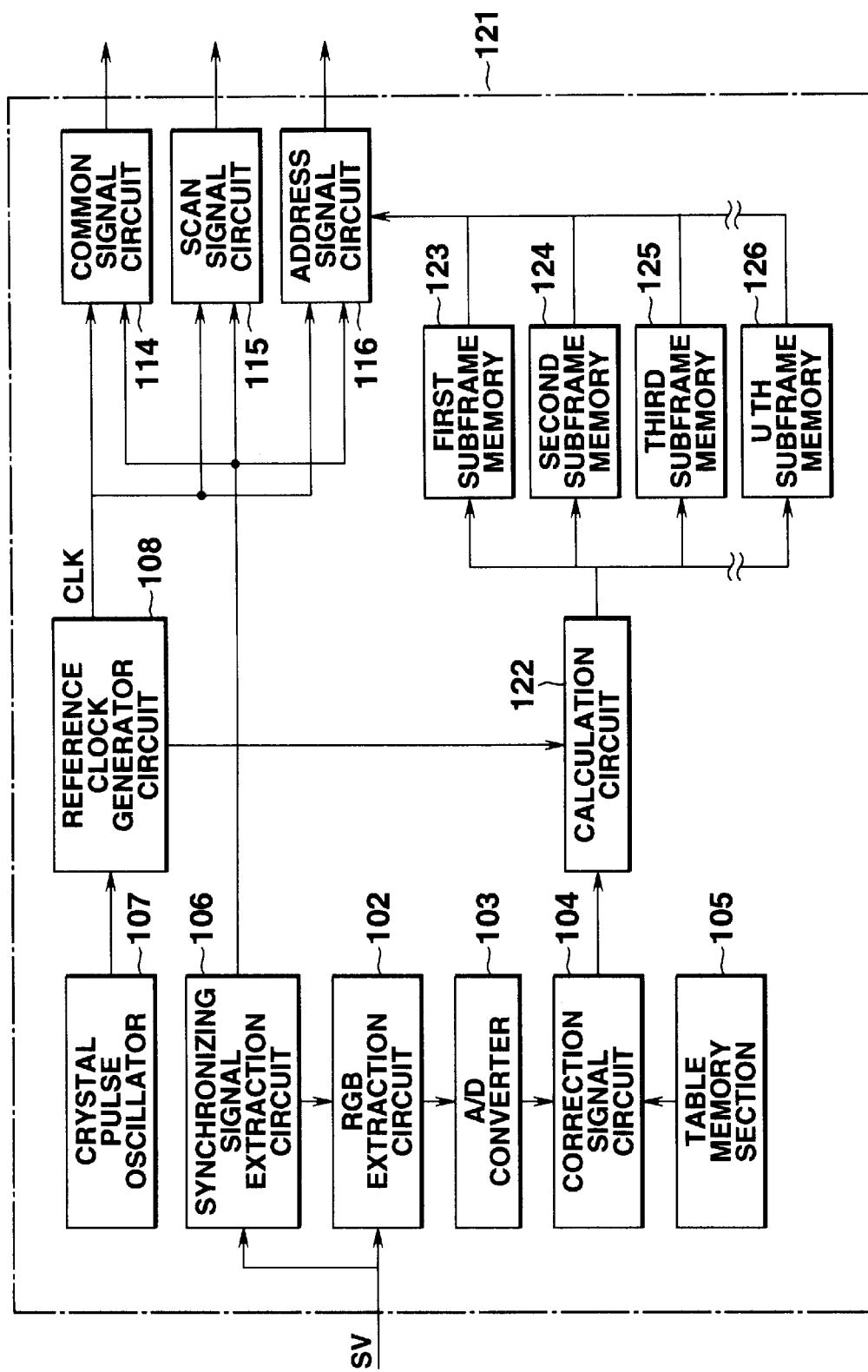
FIG. 9 is a block diagram depicting the structure of a control circuit which performs subframe driving on an organic electroluminescent display panel and an organic electroluminescent address panel according to a second embodiment.
Figure 10:
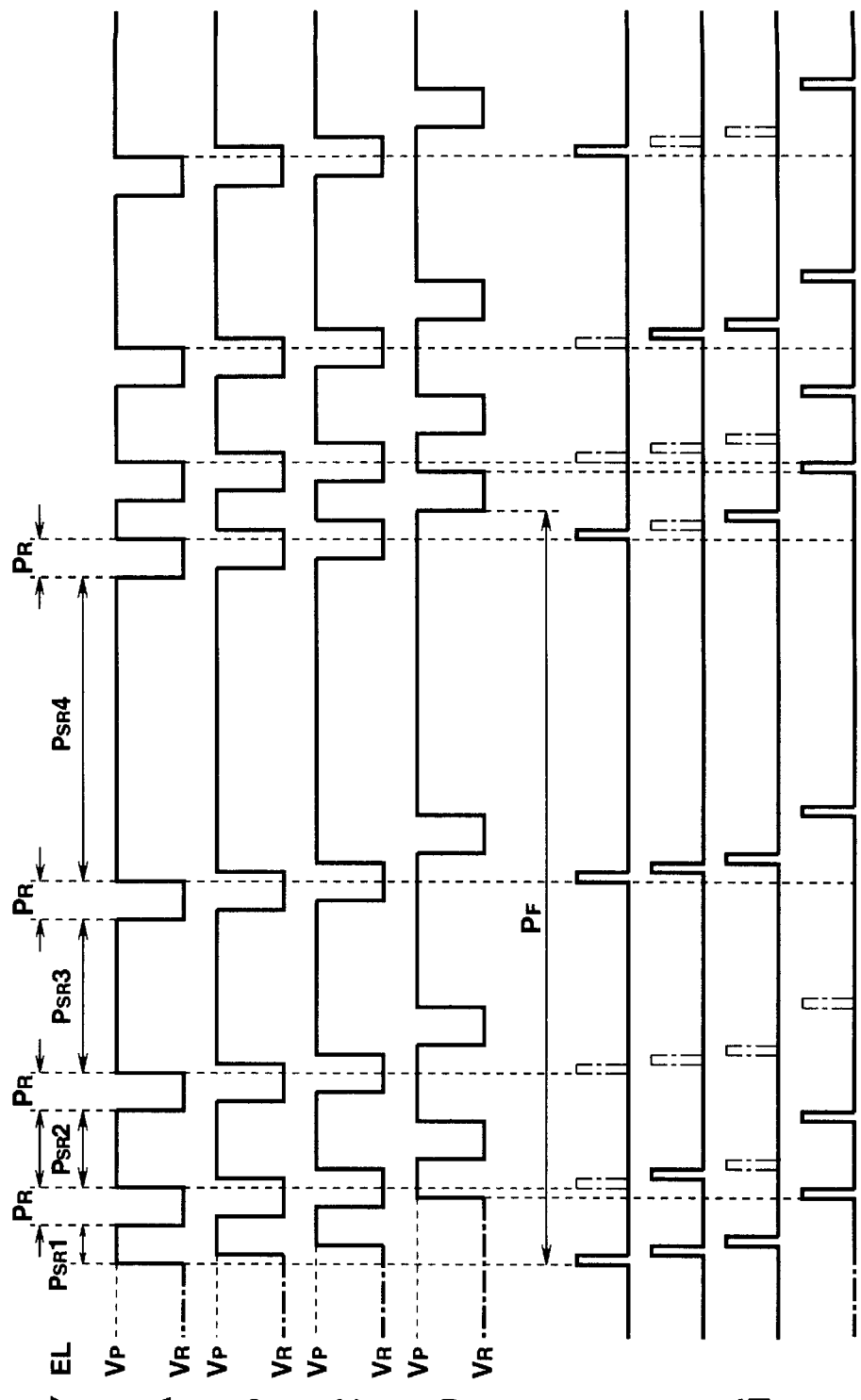
FIGS. 10A through 10H are waveform charts illustrating gradation control on a matrix of pixels by subframe driving in the second embodiment.

Although gradation control is carried out with the address light in each subfield in the first embodiment, an organic electroluminescent display device according to the second embodiment illustrated in FIG. 9 is so designed that "2V" gradation control (U: an integer equal to or greater than 1) is executed by selecting light emission of the organic electroluminescent display panel 12 in each of subframes where the period of application of the forward bias voltage $V_P$ to the transparent electrode 15 and the transparent electrodes 19 differs among a first subframe memory 123 to a "U-th" subfield memory 126.

FIGS. 10A through 10H respectively corresponding to FIGS. 7A–7H present waveform charts for the operation for 16 gradation display. Luminescent luminance gradation is determined by computing the light emission times in a first subframe period $P_{SR}1$ for each display light emitting dot ELdp of the organic electroluminescent display panel 12 to emit light including light of a luminance unit "1," a second subframe period $P_{SR}2$ for each display light emitting dot ELdp to emit light including light of a luminance unit "2," a third subframe period $P_{SR}3$ for each display light emitting dot ELdp to emit light including light of a luminance unit "4," and a fourth subframe period $P_{SR}4$ for each display light emitting dot ELdp to emit light including light of a luminance unit "8." That is, the time lengths are so set as to give the following ratio:

$$P_{SR}1:P_{SR}2:P_{SR}3:P_{SR}4=1:2:4:8.$$

A calculation circuit 122 sends to the first subframe memory 123 data among the compensated image signals Sp of the first row, the second row, . . . and the p-th row, which is addressed to the address light emitting dot ELad corresponding to the display light emitting dot ELdp that emits light including light of the luminance unit "1." In the first subframe period $P_{SR}1$, the address signal circuit 116 sends the address signals to the first address electrodes 20 and the second address electrodes 22 in the order of the first row, the second row, . . . and the p-th row as shown in FIGS. 10E–10H, based on the reference clock CLK in accordance with the data from the first subframe memory 123, so that the selected address light emitting dots ELad of the organic electroluminescent address panel 13 sequentially emit lights row by row.

The common signal circuit 114 supplies the common signal to the transparent electrode 15 of the organic electroluminescent display panel 12 in the subframe period $P_{SR}$ based on the horizontal sync signal and the reference clock CLK, and the scan signal circuit 115 supplies the scan signal to the transparent electrodes 19 of the organic electroluminescent display panel 12 in the order of the first row, the second row, . . . and the p-th row in the subframe period $P_{SR}$ based on the horizontal sync signal and the reference clock CLK, thereby applying the forward bias voltage $V_P$ as shown in FIGS. 10A–10D to the organic electroluminescent layer 18 and the phototransistor 16. The phototransistor LTr that has received the address light from the organic electroluminescent address panel 13 will have a low resistance and keeps emitting light until the reset period $P_R$ or for the first gradation period $P_G1$ to provide display with the luminance gradation "1."

In the second subframe period $P_{SR}2$, the address signal circuit 116 sends the address signals to the first address electrodes 20 and the second address electrodes 22 in the order of the first row, the second row, . . . and the p-th row as shown in FIGS. 10E–10H based on the reference clock CLK in accordance with the data from the second subframe memory 124, so that the selected address light emitting dots ELad of the organic electroluminescent address panel 13 sequentially emit lights row by row. At this time, the forward bias voltage $V_P$ is supplied to the individual rows of display light emitting dots ELdp, which keep emitting light for a period which is the first subframe period $P_{SR}1$ subtracted from the first gradation period $P_G$ in accordance with the light emission from the address light emitting dots ELad, thus presenting display with the luminance gradation "2." Those display light emitting dots ELdp which have been selected in both subframe periods $P_{SR}1$ and $P_{SR}2$ provide display with the luminance gradation "3" then.

In the third subframe period $P_{SR}3$, the address signal circuit 116 sends the address signals to the first address electrodes 20 and the second address electrodes 22 in the order of the first row, the second row, . . . and the p-th row as shown in FIGS. 10E–10H based on the reference clock CLK in accordance with the data from the third subframe memory 125, so that the selected address light emitting dots ELad of the organic electroluminescent address panel 13 sequentially emit lights row by row. At this time, the forward bias voltage $V_P$ is supplied to the individual rows of display light emitting dots ELdp, which provide display with the luminance gradation "4" in accordance with light emission of the address light emitting dots ELad. Those display light emitting dots ELdp which have been selected in all the subframe periods $P_{SR}1$, $P_{SR}2$ and $P_{SR}3$ provide display with the luminance gradation "7" then.

In the fourth subframe period $P_{SR}4$, the address signal circuit 116 sends the address signals to the first address electrodes 20 and the second address electrodes 22 in the order of the first row, the second row, . . . and the p-th row as shown in FIGS. 10E–10H based on the reference clock CLK, so that the selected address light emitting dots ELad of the organic electroluminescent address panel 13 sequentially emit lights row by row. At this time, the forward bias voltage $V_P$ is supplied to the individual rows of display light emitting dots ELdp, which provide display with the luminance gradation "8" in accordance with light emission of the address light emitting dots ELad. Those display light emitting dots ELdp which have been selected in every one of the subframe periods $P_{SR}1$, $P_{SR}2$, $P_{SR}3$ and $P_{SR}4$ provide display with the luminance gradation "15" then.

Those display light emitting dots ELdp which correspond to the address light emitting dots ELad that have not emitted light during the first subframe period $P_{SR}1$ to the fourth subframe period $P_{SR}4$ do not emit light, giving display with the luminance gradation "0." When each subframe period $P_{SR}$ ends, the reverse bias voltage $V_R$ is applied to the display light emitting dots ELdp of the first row to the p-th row which are keeping light emission in the reset period $P_R$, so that carriers are gone from the organic electroluminescent layer 18, which in turn stops light emission, and the feedback light Lb vanishes. This turns the phototransistor 16 off.

One frame period $P_F$ for displaying one image continues from the first subframe period $P_{SR}1$ for the first row to the fourth subframe period $P_{SR}4$ for the p-th row. When the reset period $P_R$ immediately following the fourth subframe period $P_{SR}4$ for the p-th row ends, the first subframe period $P_{SR}1$ in the next frame period $P_F$ starts subsequently. Gradation display can be implemented by irradiating the proper address light at the beginning of each subframe period $P_{SR}$.

Although the subframe periods $P_{SR}$ are arranged in the order of the one with the shortest length toward a larger one, namely, "1," "2," "4" and "8," they may be arranged in the reverse order of "8," "4," "2" and "1" or at random like "1," "8," "2" and "4."

Third Embodiment

Figure 13:
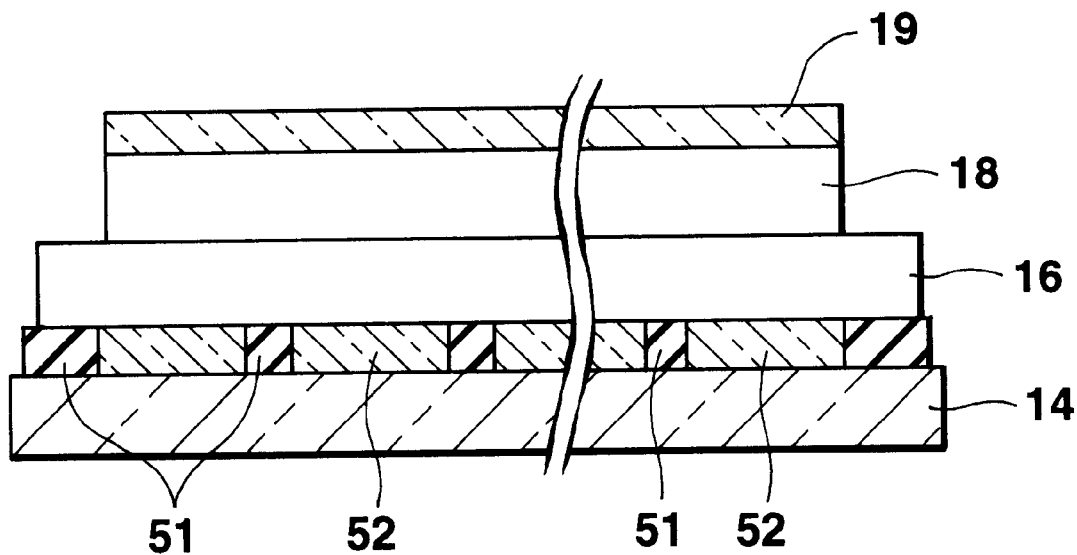
FIG. 13 is a cross-sectional view of an organic electroluminescent display panel according to a third embodiment of this invention.

FIG. 13 is a cross-sectional view showing only the organic electroluminescent display panel. The structure of the unillustrated organic electroluminescent address panel in this embodiment is the same as that of the first embodiment. In this embodiment, a plurality of electrodes 52 are formed in a stripe form with insulator layers 51 in between. The transparent electrodes 52 are therefore aligned perpendicular to the transparent electrodes 19 in a stripe form via the phototransistor 16 and the organic electroluminescent layer 18, forming an X-Y matrix. The other structures of the organic electroluminescent display panel are the same as those of the organic electroluminescent display panel 12 of the first embodiment. As the transparent electrodes 52 are formed for the respective rows of pixels in the third embodiment, the drive voltage should be designed to be applied at a predetermined timing. The other actions, operations and advantages of this modification are the same as those of the first embodiment.

Fourth Embodiment

Figure 14:
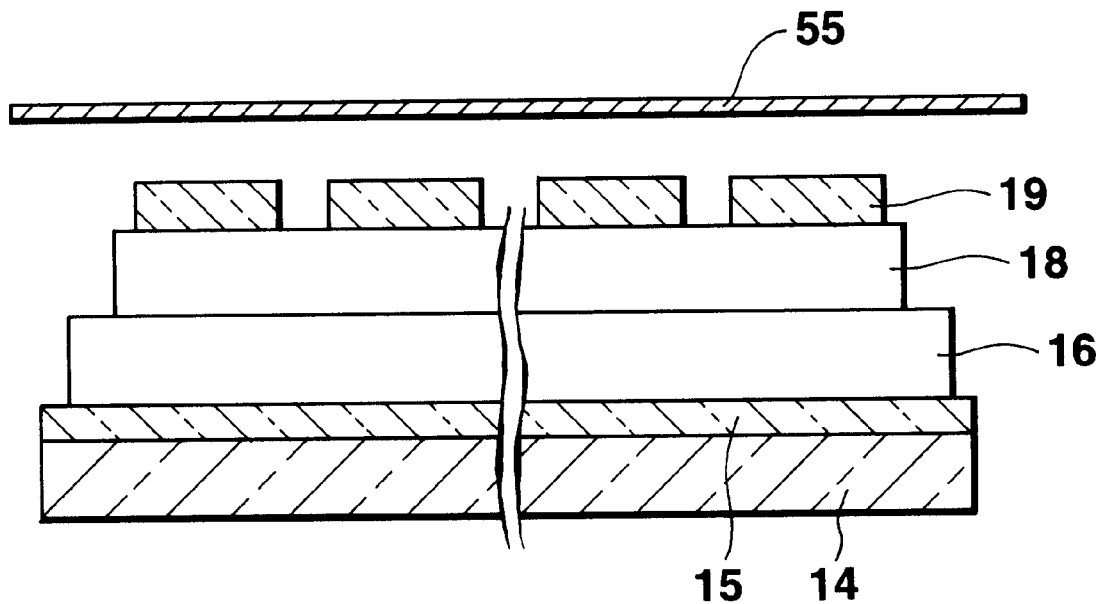
FIG. 14 is a cross-sectional view showing an organic electroluminescent display panel according to a fourth embodiment of this invention.

FIG. 14 illustrates a display device according to the fourth embodiment of this invention, and shows only its organic electroluminescent display panel 12. In this embodiment, a light reducing filter 55 is provided in front of the organic electroluminescent display panel 12. This light reducing filter 55 can prevent the phototransistor 16 from malfunctioning due to the outside light with intense luminance. The other structures of the fourth embodiment are the same as those of the first embodiment. The actions, operations and advantages of this embodiment are the same as those of the first embodiment.

Fifth Embodiment

Figure 15:
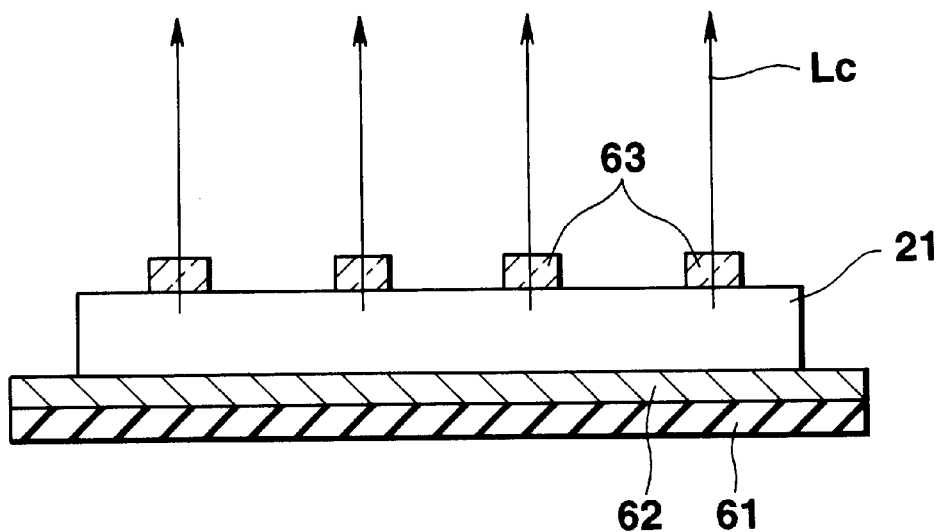
FIG. 15 is a cross-sectional view of an organic electroluminescent display panel according to a fifth embodiment of this invention.

FIG. 15 is a cross-sectional view showing only the organic electroluminescent address panel of a display device according to the fifth embodiment of this invention. In this embodiment, the organic electroluminescent address panel has stripe electrodes 62 formed in front of a substrate 61. The substrate 61 need not pass the address light and can thus be formed of any cathode metal material, such as Mg—In or Mg—Ag. Provided on the substrate 61 and the electrodes 62 is the organic electroluminescent layer 21 on which electrodes 63 that form an X-Y matrix with the electrodes 62 are formed. In this embodiment, the address light LC passes through the electrodes 63 and goes out, and is designed not to pass through the substrate 61. In this embodiment, therefore, no absorption of the address light Lc occurs in the substrate so that the address light Lc is not attenuated. The other actions, operations and advantages in this modification are the same as those of the first embodiment.

Sixth Embodiment

Figure 16:
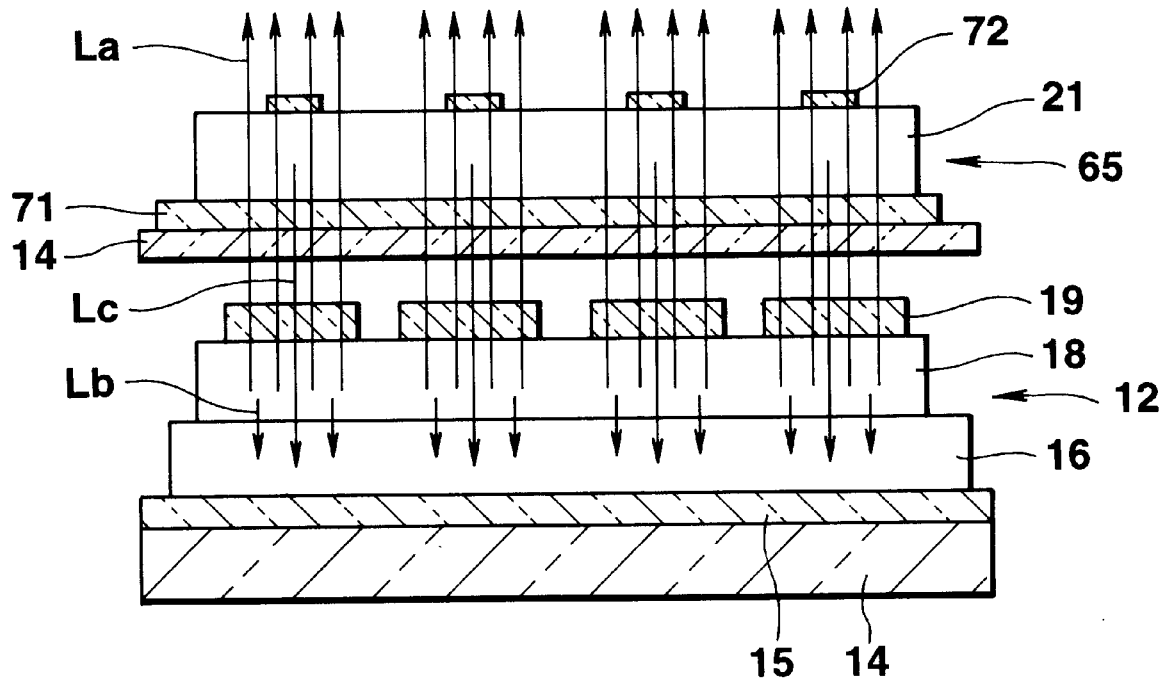
FIG. 16 is a cross-sectional view of a display device according to a sixth embodiment of this invention.

FIG. 16 is a cross-sectional view depicting a display device according to the sixth embodiment of this invention. In this embodiment, the arrangement of the organic electroluminescent display panel 12 and the organic electroluminescent address panel 13 (65) of the first embodiment is reversed. That is, the organic electroluminescent address panel 65 of the first embodiment is flipped over and is laid in front of the organic electroluminescent display panel 12. Note that electrodes 71 of the organic electroluminescent address panel 65 should be designed to have transparency to the display light La that is emitted from the organic electroluminescent display panel 12 located at the back; for example, the electrodes 71 may be formed thin of a material with a low work function. Likewise, electrodes 72 show transparency to the display light La.

The other actions, operations and advantages in this modification are substantially the same as those of the first embodiment.

Although each of the organic electroluminescent layer 18 and the organic electroluminescent layer 21 is comprised of three organic carrier transport layers in the above-described first to sixth embodiments, this invention may take such a structure that uses a light emitting layer with an electron transporting property so that the electron transport layer also serves as the light emitting layer, or such a structure that uses a light emitting layer with a hole transporting property so that the hole transport layer also serves as the light emitting layer, or the layers 18 and 21 may each consist of less than three layers or more than three layers. The electroluminescent layer for emission of red light has a double layer structure which comprises an electron-transporting light emitting layer having 4-(dicyanomethylene)-2-methyl-6-(p-dimethylaminostyryl)-4H-pyran dispersed as a guest in Alq3 or a host, and a hole transport layer of a-NPD. The electroluminescent layer for emission of green light has a double layer structure which comprises an electron-transporting light emitting layer consisting of beryllium-bis(10-hydroxybenzo[h]quinolinate), and a hole transport layer of a-NPD. The electroluminescent layer for emission of blue light has a triple layer structure which comprises an electron transport layer of Alq3, a light emitting layer consisting of 96% by weight of 4,4'-bis(2,2-diphenylvinylene)biphenyl and 4% by weight of 4,4'-bis(2,2-carbazole)vinylene) biphenyl, and a hole transport layer of a-NPD.

Figure 19:
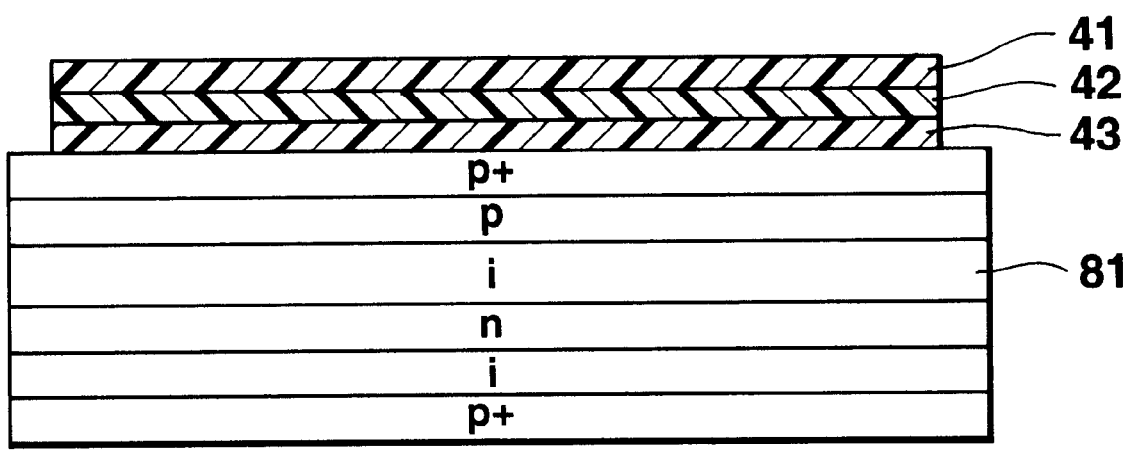
FIG. 19 is a cross-sectional view of a modification of each embodiment which uses a PNP bipolar phototransistor instead of an NPN bipolar phototransistor.

Although amorphous silicon is used for the phototransistor 16 in the first to sixth embodiments, the material is not limited to this particular one if it can be excited by the address light from the organic electroluminescent address panel 13 to generate carriers. The phototransistor 16 has the carrier injection electrodes 37, which may be omitted if the other components carrier have a high carrier injection property. The NPN type bipolar phototransistor 16 may be replaced with a PNP type bipolar phototransistor 81 as shown in FIG. 19. In this case, the hole transport layer 43 is provided on the phototransistor side 16, and the electron transport layer 41 on the transparent electrode side 19. Therefore, the transparent electrodes 19 are formed of a transparent cathode material on the organic electroluminescent display layer. This transparent electrode 19 may be comprised of a film of a low work function material like Mg with a thickness of about 20 to 100 angstroms, thin enough for the visible light to pass through, and a transparent film of ITO or the like. Although the transparent electrodes 19 are equal in number to the second address electrodes 22 are formed in a stripe pattern to be in parallel to one another and the single transparent electrode 15 is associated with the entire display light emitting dots ELdp, a single transparent electrode 19 may be provided on the organic electroluminescent layer 18 in association with the whole display light emitting dots ELdp while a plurality of transparent electrodes 15 equal in number to either the electrodes 20 or the electrodes 22 of the organic electroluminescent address panel 13 may be formed under the bipolar phototransistor 16 in parallel to one another.

Although the reverse bias voltage $V_R$ (negative voltage) is applied between the transparent electrodes 19 and the transparent electrode 15 in the reset period $P_R$ for the extinction of light in the first to sixth embodiments, a voltage of 0 V or higher may be used as long as the voltage is lower than the threshold value at which the organic electroluminescent layer 18 emits light.

What is claimed is:

1. A method of driving a display device comprising:

a forward bias voltage supply step of applying a forward bias voltage between a first display electrode and second display electrodes of an electroluminescent display panel in a gradation period having a first subfield period and a second subfield period coming after said first subfield period, said electroluminescent display panel including said first display electrode, a phototransistor provided on said first display electrode, showing a conductivity according to incidence of light emitted from said address electroluminescent layer and having a non-linear light vs. conductivity characteristics, a display electroluminescent layer, provided on said phototransistor, for emitting light as carriers are injected inside, and said second display electrodes provided on said display electroluminescent layer; and a luminescent gradation control step of selectively applying a voltage between first address electrodes and second address electrodes of an electroluminescent address panel in either said first subfield period or said second subfield period in said gradation period, said electroluminescent address panel including an address electroluminescent layer for emitting light in accordance with injected carriers, said first address electrodes provided on one side of said address electroluminescent layer and said second address electrodes provided on the other side of said address electroluminescent layer.

2. The method according to claim 1, further comprising a reset voltage supply step of applying a reset voltage lower than said forward bias voltage between said first display electrode and said second display electrodes after said forward bias voltage supply step.

3. The method according to claim 1, wherein said phototransistor shows a conductivity with respect to incidence of light emitted from said display electroluminescent layer of said electroluminescent display panel.

4. A method of driving a display device comprising:

a forward bias voltage supply step of applying a forward bias voltage between a first display electrode and second display electrodes of an electroluminescent display panel in a frame period having a first subframe period and a second subframe period coming after said first subframe period, said electroluminescent display panel including said first display electrode, a phototransistor provided on said first display electrode, showing a conductivity according to incidence of light emitted from said address electroluminescent layer and having a non-linear light vs. conductivity characteristics, a display electroluminescent layer, provided on said phototransistor, for emitting light as carriers are injected inside, and said second display electrodes provided on said display electroluminescent layer; and a luminescent gradation control step of selectively applying a voltage between first address electrodes and second address electrodes of an electroluminescent address panel in either said first subframe period or said second subframe period in said frame period, said electroluminescent address panel including an address electroluminescent layer for emitting light in accordance with injected carriers, said first address electrodes provided on one side of said address electroluminescent layer and said second address electrodes provided on the other side of said address electroluminescent layer.

5. The method according to claim 4, further comprising a reset voltage supply step of applying a reset voltage lower than said forward bias voltage between said first display electrode and said second display electrodes after said forward bias voltage supply step.

6. The method according to claim 4, wherein said phototransistor shows a conductivity with respect to incidence of light emitted from said display electroluminescent layer of said electroluminescent display panel.

* * * * *